United States Patent
Talone et al.

(10) Patent No.: US 10,490,404 B2
(45) Date of Patent: Nov. 26, 2019

(54) METHOD OF IN SITU HARD MASK REMOVAL

(71) Applicant: Tokyo Electron Limited, Tokyo (JP)

(72) Inventors: Christopher Talone, Slingerlands, NY (US); Andrew Nolan, Troy, NY (US); Mingmei Wang, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 85 days.

(21) Appl. No.: 15/708,206

(22) Filed: Sep. 19, 2017

(65) Prior Publication Data
US 2018/0082842 A1    Mar. 22, 2018

Related U.S. Application Data

(60) Provisional application No. 62/396,688, filed on Sep. 19, 2016.

(51) Int. Cl.
*H01L 21/033* (2006.01)
*H01L 21/02* (2006.01)
(Continued)

(52) U.S. Cl.
CPC ...... *H01L 21/0337* (2013.01); *H01L 21/0206* (2013.01); *H01L 21/0332* (2013.01);
(Continued)

(58) Field of Classification Search
CPC ............ H01L 21/0337; H01L 21/0206; H01L 21/0332; H01L 21/31138; H01L 21/31144;
(Continued)

(56) References Cited

U.S. PATENT DOCUMENTS 6,497,993 B1    12/2002  Chiu et al.
6,903,023 B2     6/2005  Wise et al.
(Continued)

FOREIGN PATENT DOCUMENTS

KR    2016-0002059 A    1/2016

OTHER PUBLICATIONS

PCT Office, International Preliminary Report on Patentability issued in corresponding PCT/US2017/052222 dated Mar. 19, 2019, 7 pages.
(Continued)

*Primary Examiner* — Timor Karimy
(74) *Attorney, Agent, or Firm* — Wood Herron & Evans LLP

(57) ABSTRACT

Systems and methods for in situ hard mask removal are described. In an embodiment, a method includes receiving a semiconductor workpiece comprising a substrate, an intermediary layer, a hard mask layer, and a photoresist layer in an etch chamber. The method may also include etching the hard mask layer to open a region left exposed by the photoresist layer. Additionally, such an embodiment may include etching the intermediary layer in a region left exposed by the hard mask layer. The method may also include removing the hard mask layer. In such embodiments, etching the hard mask layer, etching the intermediary layer, and removing the hard mask layer are performed in the etch chamber, and without the wafer being removed from the etch chamber.

17 Claims, 8 Drawing Sheets

(51) Int. Cl.
   *H01L 21/311* (2006.01)
   *H01L 21/67* (2006.01)
   *H01L 21/683* (2006.01)
   *H01L 21/66* (2006.01)

(52) U.S. Cl.
   CPC .. *H01L 21/31116* (2013.01); *H01L 21/31144* (2013.01); *H01L 21/67069* (2013.01); *H01L 21/67253* (2013.01); *H01L 21/6831* (2013.01); *H01L 22/26* (2013.01)

(58) Field of Classification Search
   CPC ......... H01L 21/67069; H01L 21/67253; H01L 21/6831; H01L 22/26
   See application file for complete search history.

(56) References Cited

U.S. PATENT DOCUMENTS

| | | |
|---|---|---|
| 7,078,334 B1 | 7/2006 | Chowdhury et al. |
| 9,093,387 B1 | 7/2015 | Allen et al. |
| 2005/0003653 A1* | 1/2005 | Kanamura ........ H01L 21/76811 438/622 |
| 2005/0287796 A1* | 12/2005 | Nam ................. H01L 21/31116 438/638 |
| 2010/0055913 A1 | 3/2010 | Zhang et al. |
| 2010/0291771 A1* | 11/2010 | Zhou ................... H01L 21/0337 438/710 |
| 2012/0208369 A1* | 8/2012 | Nishizuka ......... H01J 37/32192 438/714 |
| 2015/0380267 A1 | 12/2015 | Han et al. |

OTHER PUBLICATIONS

International Searching Authority, Written Opinion issued in counterpart International Appl. No. PCT/US2017/052222 dated Jan. 11, 2018, 5 pp.

\* cited by examiner

METHOD OF IN SITU HARD MASK REMOVAL

CROSS-REFERENCE TO RELATED APPLICATIONS

The present application claims the benefit of U.S. Provisional Application No. 62/396,688, filed on Sep. 19, 2016, entitled "Method of In Situ Hard Mask Removal," which is incorporated herein by reference in its entirety.

BACKGROUND OF THE INVENTION

Field of Invention

The present invention relates to systems and methods for substrate processing, and more particularly to a method and system for in situ hard mask removal.

Description of Related Art

Lithographic processes using radiation sensitive material (also referred to herein as "resist") are widely used in the manufacture of semiconductor devices and other patterned structures. In track photolithographic processing used in the fabrication of semiconductor devices, the following types of processes may be performed in sequence: photoresist coating that coats a photoresist solution on a semiconductor wafer to form a photoresist film, heat processing to cure the coated photoresist film, exposure processing to expose a predetermined pattern on the photoresist film, heat processing to promote a chemical reaction within the photoresist film after exposure, developing processing to develop the exposed photoresist film and form a photoresist pattern, etching a fine pattern in an underlying layer or substrate using the photoresist pattern, etc.

In a previously known semiconductor process shown in FIG. 1, a semiconductor wafer 102 may be patterned with a photoresist layer over a hard mask deposited on an organic layer formed on the semiconductor wafer 102. At a first step 104, the semiconductor wafer 102 may be introduced into a first chamber for opening the hard mask in a region exposed by the patterned photoresist, and features are opened in the organic layer. At a second step 106, the semiconductor wafer 102 is then introduced into a second chamber for wet etch removal of the hard mask. At a third step 108, the semiconductor wafer 102 is reintroduced into the first chamber for feature etch. The final workpiece having a plurality of features 112 formed on the semiconductor wafer 102 is the result.

One problem with the process described in FIG. 1 is that the process requires transfer of the semiconductor wafer 102 from chamber to chamber, thereby increasing processing time, cost, and potential for contamination and other processing errors.

SUMMARY OF THE INVENTION

Systems and methods for in situ hard mask removal are described. In an embodiment, a method includes receiving a semiconductor workpiece comprising a substrate, an intermediary layer, a hard mask layer, and a photoresist layer in an etch chamber. The method may also include etching the hard mask layer to open a region left exposed by the photoresist layer. Additionally, such an embodiment may include etching the intermediary layer in a region left exposed by the hard mask layer. The method may also include removing the hard mask layer. In such embodiments, etching the hard mask layer, etching the intermediary layer, and removing the hard mask layer are performed in the etch chamber, and without the wafer being removed from the etch chamber.

An embodiment of a system for processing semiconductor devices may include a plasma etch device configured to: receive a semiconductor workpiece comprising a substrate, an intermediary layer, a hard mask layer, and a photoresist layer in an etch chamber, etch the hard mask layer to open a region left exposed by the photoresist layer, etch the intermediary layer in a region left exposed by the hard mask layer, and remove the hard mask layer, wherein etching the hard mask layer, etching the intermediary layer, and removing the hard mask layer are performed in the etch chamber, and without the wafer being removed from the etch chamber.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
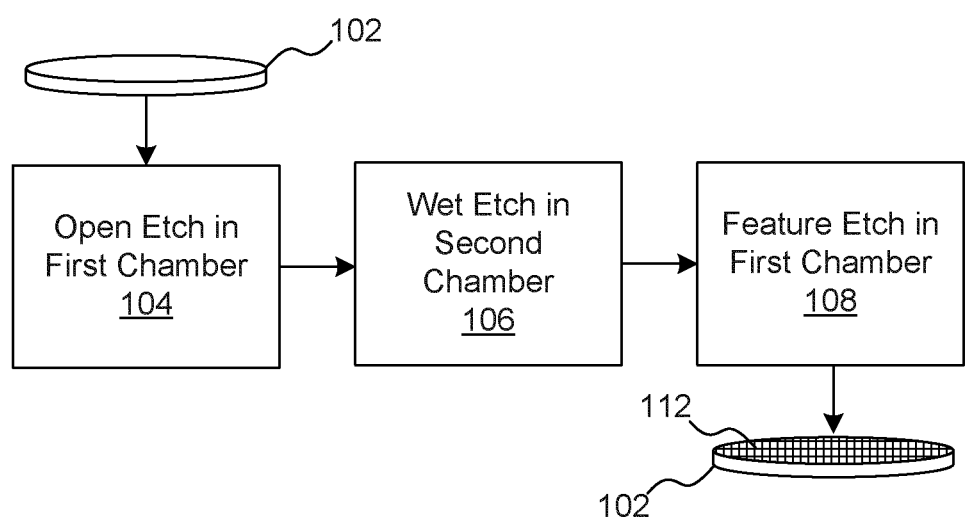
FIG. 1 is a flow diagram illustrating one embodiment of a prior art processing flow for manufacturing a semiconductor device.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Rather than perform a wet etch in between two dry etches as described in the process of FIG. 1, the present embodiments allow for all steps to be performed in one single dry etch chamber, thus eliminating two instances of wafer transfer and waiting and saving processing time. In some embodiments, up to one hour of processing time per lot may be saved.

Referring now to the drawings, where like reference numerals designate identical or corresponding parts throughout the several views.

Figure 2:
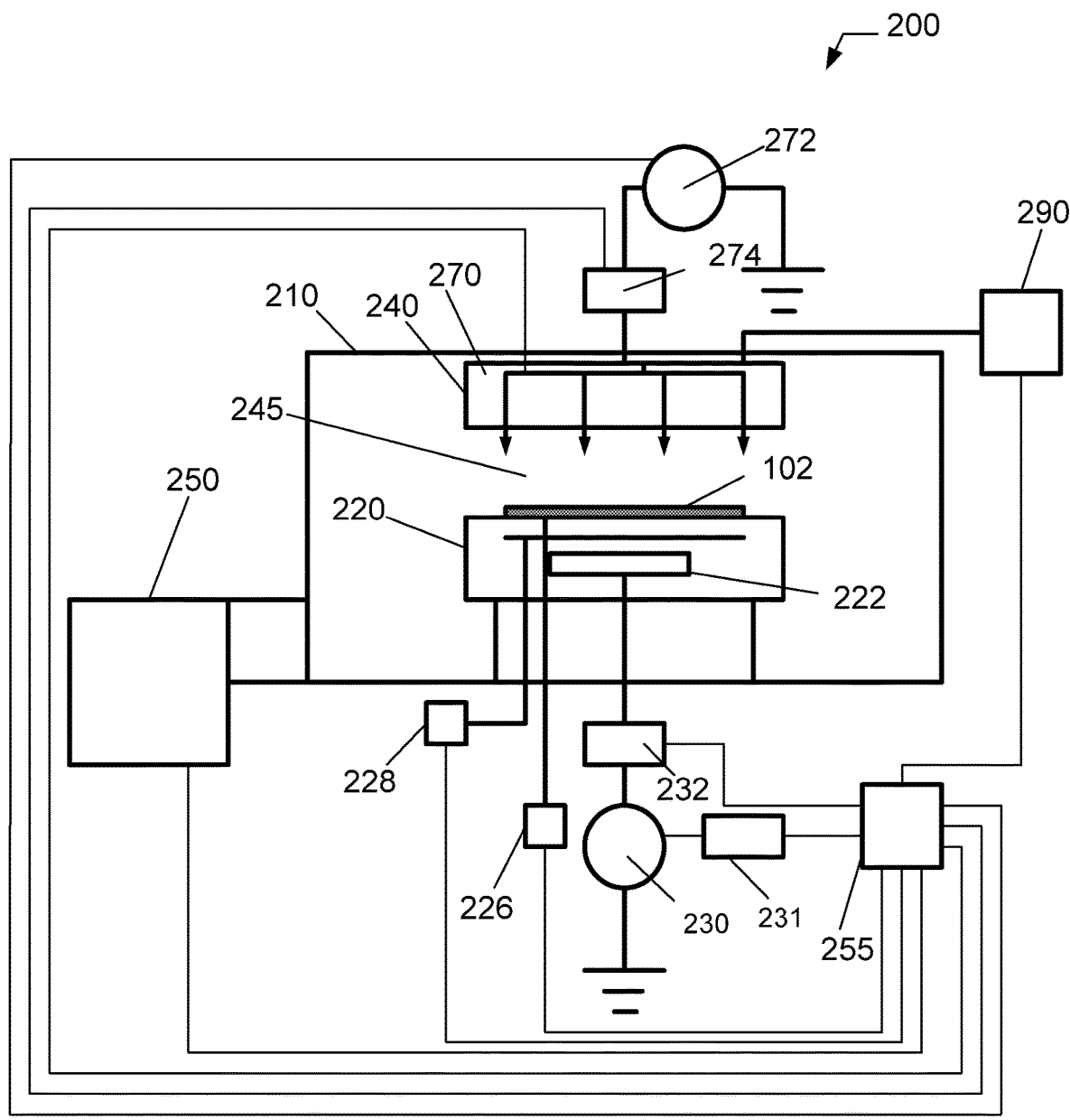
FIG. 2 is a schematic block diagram illustrating one embodiment of a system configured for in situ hard mask removal.

FIG. 2 is an embodiment of a system 200 for in situ hard mask removal. In an embodiment, the system 200 includes an etch chamber 210, substrate holder 220, upon which a semiconductor wafer 102 to be processed is affixed, and vacuum pumping system 250. Semiconductor wafer 102 can be a semiconductor substrate, a wafer, a flat panel display, or a liquid crystal display. Etch chamber 210 can be configured to facilitate etching the processing region 245 in the vicinity of a surface of semiconductor wafer 102. An ionizable gas or mixture of process gases is introduced via a gas distribution system 240. For a given flow of process gas, the process pressure is adjusted using the vacuum pumping system 250. The processing can aid the removal of material from the exposed surfaces of semiconductor wafer 102. The etch processing system 200 can be configured to process substrates of any desired size, such as 200 mm substrates, 300 mm substrates, or larger.

Semiconductor wafer 102 can be affixed to the substrate holder 220 via a clamping system 228, such as a mechanical clamping system or an electrical clamping system (e.g., an electrostatic clamping system). Furthermore, substrate holder 220 can include a heating system (not shown) or a cooling system (not shown) that is configured to adjust and/or control the temperature of substrate holder 220 and semiconductor wafer 102. The heating system or cooling system may comprise a re-circulating flow of heat transfer fluid that receives heat from substrate holder 220 and transfers heat to a heat exchanger system (not shown) when cooling, or transfers heat from the heat exchanger system to substrate holder 220 when heating. In other embodiments, heating/cooling elements, such as resistive heating elements, or thermo-electric heaters/coolers can be included in the substrate holder 220, as well as the chamber wall of the etch chamber 210 and any other component within the processing system 200.

Additionally, a heat transfer gas can be delivered to the backside of semiconductor wafer 102 via a backside gas supply system 226 in order to improve the gas-gap thermal conductance between substrate 825 and substrate holder 220. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of semiconductor wafer 102.

In the embodiment shown in FIG. 2, substrate holder 220 can comprise an electrode 222 through which RF power is coupled to the processing region 245. For example, substrate holder 220 can be electrically biased at a RF voltage via the transmission of RF power from a RF generator 230 through an optional impedance match network 232 to substrate holder 220. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 222 at a RF voltage may be pulsed using pulsed bias signal controller 231. The RF power output from the RF generator 230 may be pulsed between an off-state and an on-state, for example. Alternately, RF power is applied to the substrate holder electrode at multiple frequencies. Furthermore, impedance match network 232 can improve the transfer of RF power to plasma in plasma etch chamber 210 by reducing the reflected power. Match network topologies (e.g. L-type, π-type, T-type, etc.) and automatic control methods are well known to those skilled in the art.

Gas distribution system 240 may comprise a showerhead design for introducing a mixture of process gases. Alternatively, gas distribution system 240 may comprise a multi-zone showerhead design for introducing a mixture of process gases and adjusting the distribution of the mixture of process gases above semiconductor wafer 102. For example, the multi-zone showerhead design may be configured to adjust the process gas flow or composition to a substantially peripheral region above semiconductor wafer 102 relative to the amount of process gas flow or composition to a substantially central region above semiconductor wafer 102.

Vacuum pumping system 250 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma etch chamber 210.

As mentioned above, the controller 255 can comprise a microprocessor, memory, and a digital I/O port capable of generating control voltages sufficient to communicate and activate inputs to processing system 200 as well as monitor outputs from plasma processing system 200. Moreover, controller 255 can be coupled to and can exchange information with RF generator 230, gas supply 290, pulsed bias signal controller 231, impedance match network 232, the gas distribution system 240, vacuum pumping system 250, as well as the substrate heating/cooling system (not shown), the backside gas supply system 226, and/or the electrostatic clamping system 228. For example, a program stored in the memory can be utilized to activate the inputs to the aforementioned components of processing system 200 according to a process recipe in order to perform a plasma assisted process, such as a plasma etch process or a post heating treatment process, on semiconductor wafer 102.

In addition, the processing system 200 can further comprise an upper electrode 270 to which RF power can be coupled from RF generator 272 through optional impedance match network 274. A frequency for the application of RF power to the upper electrode can range from about 0.1 MHz to about 200 MHz. Additionally, a frequency for the application of power to the lower electrode can range from about 0.1 MHz to about 80 MHz. Moreover, controller 255 is coupled to RF generator 272 and impedance match network 274 in order to control the application of RF power to upper electrode 270. The design and implementation of an upper electrode is well known to those skilled in the art. The upper electrode 270 and the gas distribution system 240 can be designed within the same chamber assembly, as shown. Alternatively, upper electrode 270 may comprise a multi-zone electrode design for adjusting the RF power distribution coupled to plasma above semiconductor wafer 102. For example, the upper electrode 270 may be segmented into a center electrode and an edge electrode.

Depending on the applications, additional devices such as sensors or metrology devices can be coupled to the etch chamber 210 and to the controller 255 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

Figure 3:
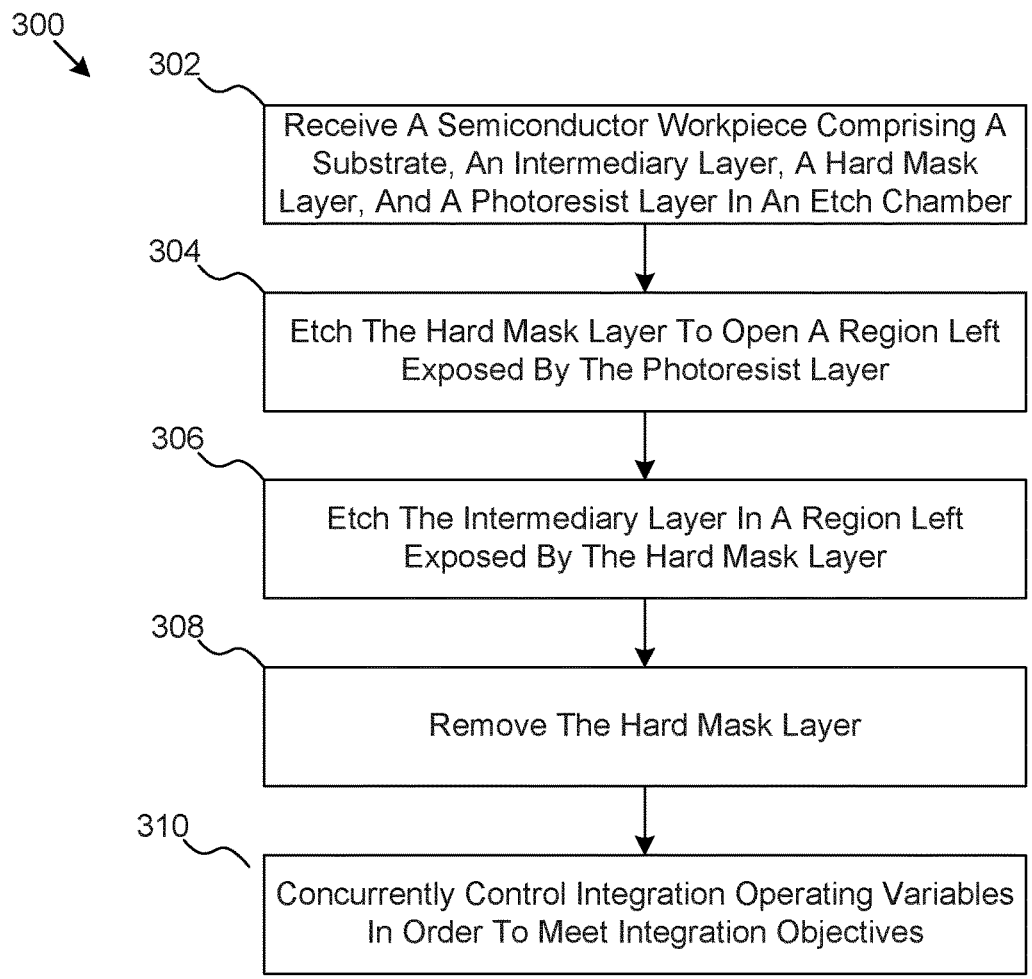
FIG. 3 is a schematic flowchart diagram illustrating one embodiment of a method for in situ hard mask removal.

FIG. 3 is a schematic flowchart diagram illustrating one embodiment of a method 300 for in situ hard mask removal. In an embodiment, the method 300 may include receiving a semiconductor workpiece comprising a substrate, an intermediary layer, a hard mask layer, and a photoresist layer in the plasma etch chamber 210, as shown at block 302. The method 300 may also include etching the hard mask layer to open a region left exposed by the photoresist layer, as shown at block 304. Also, the method 300 may include etching the intermediary layer in a region left exposed by the hard mask layer, as shown at block 306. The method 300 may also include removing the hard mask layer, as shown at block 308. In such an embodiment, etching the hard mask layer, etching the intermediary layer, and removing the hard mask layer are performed in the etch chamber, and without the wafer being removed from the etch chamber.

In further embodiments, the method 300 may include clearing the photoresist layer in the etch chamber. The method 300 may also include thinning the hard mask layer in the etch chamber. Thinning the hard mask layer may include etching with an etch chemistry that etches the hard mask layer and the intermediary layer at substantially the same rate. The method 300 may also include concurrently controlling integration operating variables in order to meet integration objectives, as shown at block 310. Control of integration objectives is discussed further below.

Figure 4:
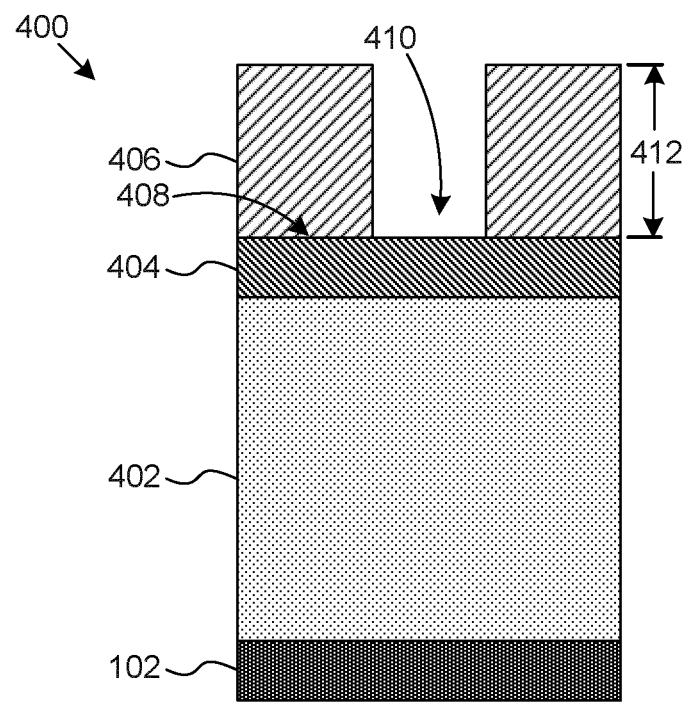
FIG. 4 is a cross-section diagram illustrating one embodiment of a semiconductor device at one stage of a semiconductor device processing flow comprising in situ hard mask removal.

FIGS. 4-9 illustrate stages of an embodiment of the semiconductor device processing methods described in FIG. 3. FIG. 4 is a cross-section diagram illustrating an embodiment of a semiconductor workpiece 400 received by the system 200. The semiconductor workpiece 400 may include a substrate, such as the semiconductor wafer 102. Additionally, the semiconductor workpiece 400 may include an intermediary layer 402 formed on the semiconductor wafer 102. Additionally, the semiconductor workpiece 400 may include a hard mask layer 404 and a photoresist layer 406 formed on the hard mask layer 404. In one embodiment, the photoresist layer 406 may be patterned, covering a first region 408 of the hard mask layer 404 and exposing a second region 410 of the hard mask layer 404. In an embodiment, the photoresist layer 406 may have a first thickness 412 when received.

Figure 5:
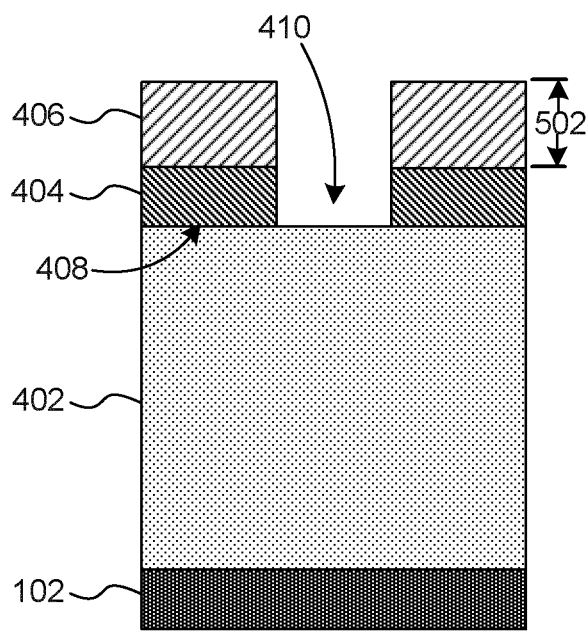
FIG. 5 is a cross-section diagram illustrating one embodiment of a semiconductor device at one stage of a semiconductor device processing flow comprising in situ hard mask removal.

FIG. 5 illustrates the workpiece 400 after etching the hard mask layer 404. In such an embodiment, the hard mask layer 404 may be opened in the second region 410, which is exposed by the photoresist layer 406. After etching the hard mask layer 404, the thickness of the photoresist layer 406 may be reduced to a second thickness 502. In an embodiment, the hard mask layer 404 may be etched with an etch chemistry comprising $CF_4$ and $O_2$.

Figure 6:
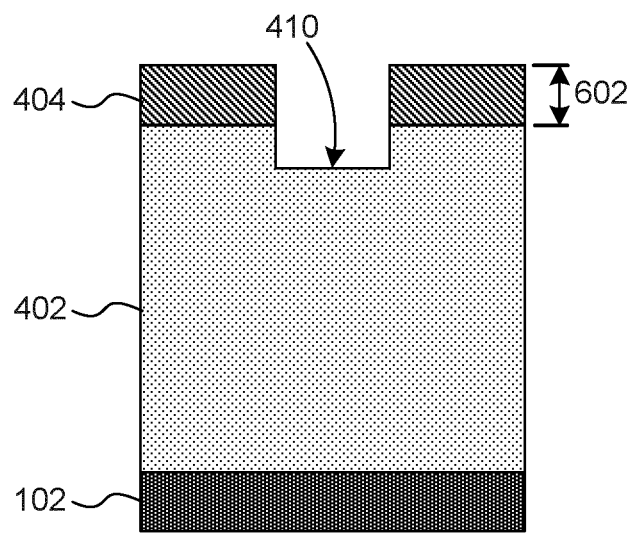
FIG. 6 is a cross-section diagram illustrating one embodiment of a semiconductor device at one stage of a semiconductor device processing flow comprising in situ hard mask removal.

FIG. 6 illustrates the workpiece 400 after clearing the photoresist layer 406. In an embodiment, the photoresist layer 406 may be etched with an etch chemistry comprising Ar and $O_2$. In such an embodiment, the intermediary layer 402 may be partially etched in the second region 410. In an embodiment, the intermediary layer 402 may comprise an organic material, such as an organic planarization layer (OPL), an optical dispersive layer (ODL), etc. The hard mask layer 404 may have a first thickness 602.

Figure 7:
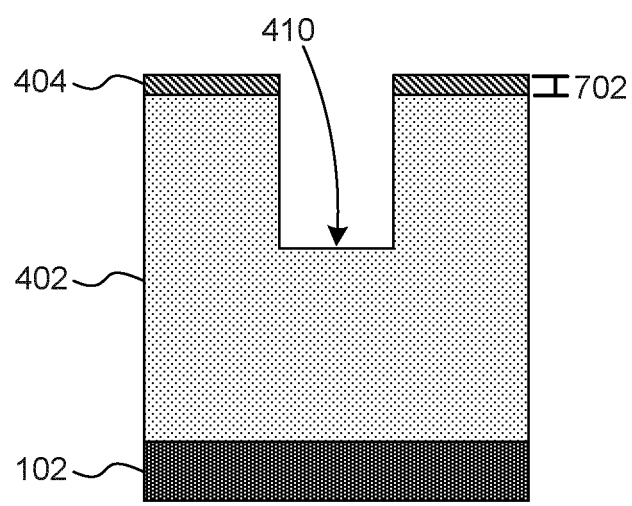
FIG. 7 is a cross-section diagram illustrating one embodiment of a semiconductor device at one stage of a semiconductor device processing flow comprising in situ hard mask removal.

In FIG. 7, the hard mask layer 404 may be thinned to a second thickness 702. In such an embodiment, the etch chemistry used to thin the hard mask layer 404 may etch the hard mask layer 404 and the intermediary layer 402 at substantially the same rate. For example, in an embodiment, the etch chemistry used for thinning the hard mask layer 404 may include $CF_4$. In such an embodiment, the hard mask layer 404 and the intermediary layer 402 may etch at substantially the same rate. Such an embodiment may thin the hard mask layer 404 without ruining the profile or etching too much of the intermediary layer 402. By thinning the hard mask layer 404, a requirement to use highly selective etch may be avoided, and exposure time to aggressive hard mask removal chemistries may be reduced.

Figure 8:
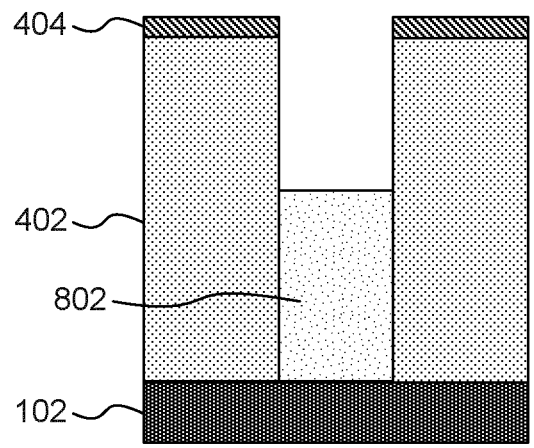
FIG. 8 is a cross-section diagram illustrating one embodiment of a semiconductor device at one stage of a semiconductor device processing flow comprising in situ hard mask removal.

In FIG. 8, the intermediary layer 402 may be etched in the second region 410. In such an embodiment, a feature 802 may be exposed or formed. An example of a feature may include a fin portion of a fin-type Field Effect Transistor (finFET), or the like. In addition, gates lines with nitride spacers may be formed according to the present embodiments. In an embodiment, the etch chemistry used for etching the intermediary layer may include $N_2$ and $H_2$.

Figure 9:
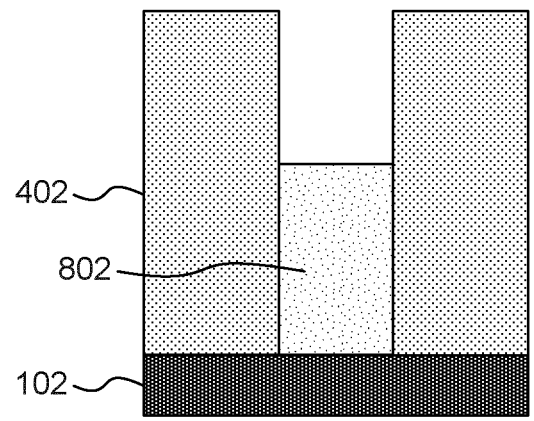
FIG. 9 is a cross-section diagram illustrating one embodiment of a semiconductor device at one stage of a semiconductor device processing flow comprising in situ hard mask removal.

In FIG. 9, the hard mask layer 404 may be removed. In such an embodiment, the etch chemistry used to remove the hard mask layer 404 may include $CF_4$.

Such embodiments, may include concurrently controlling integration operating variables in the etch chamber to meet one or more integration objectives. Examples of integration objectives may include target critical dimensions (CD), line width roughness (LWR), and line edge roughness (LER) characteristics of fabricated features. For example, semiconductor devices formed by a multi-patterning scheme that utilizes spacers, may have very specific integration objectives, depending upon the target device sizes. In one example, the target LWR is in a range from 3.5 to 4.8 nm. Similarly, in such an embodiment the LER may be in a range of 2.2 to 3.0 nm. In such embodiments, target edge placement error may be in a range of +/−0.1% to 3.0%. One of ordinary skill will recognize that various target parameters may be selected, depending upon the type of features to be formed.

Various embodiments described herein may include concurrently controlling integration operating variables in the etching the hard mask layer process, the etching the intermediary layer process, and/or the removing the hard mask layer process in order to meet integration objectives. Further embodiments may include concurrently controlling integration operating variables in at least one of a clearing the photoresist layer process and a thinning the hard mask layer process in order to meet integration objectives.

In one embodiment, concurrently controlling integration operating variables in order to meet integration objectives includes performing measurements of integration operating variables, and performing adjustments of one or more of the integration operating variables in order to meet integration objectives. Alternatively, concurrently controlling integration operating variables may include performing in situ online measurements of integration operating variables, and performing adjustments of one or more of the integration operating variables in order to meet integration objectives, wherein the adjustments are based on the in situ online measurements of the integration operating variables.

In various embodiments, the integration operating variables may be controlled according to a combination of process parameters and etch chemistries used for the various steps described in FIGS. 4-9 as described in table 1.

TABLE 1

Combination of process parameters and etch chemistries used for the various steps described in FIGS. 4-9.

| Step | Press | MW | RF | Gas | | | | | RDC | ESC Temp. | |
| --- | --- | --- | --- | --- | --- | --- | --- | --- | --- | --- | --- |
| | | | | $CF_4$ | $N_2$ | $H_2$ | Ar | $O_2$ | | C | E |
| Hard Mask Open | 40 | 0 | 100 | 150 | | | | 15 | 50 | 40 | 40 |
| Clear Photoresist | 50 | 0 | 100 | | | | 200 | 21 | 50 | 40 | 40 |
| Thin Hard Mask | 50 | 0 | 200 | 150 | | | | | 50 | 40 | 40 |
| Organic Main Etch | 80 | 2000 | 100 | | 125 | 240 | | | 50 | 45 | 50 |
| Organic OverEtch | 20 | 3000 | 150 | | 500 | 25 | | | 50 | 45 | 50 |

TABLE 1-continued

Combination of process parameters and etch chemistries used for the various steps described in FIGS. 4-9.

| Step | Press | MW | RF | CF$_4$ | N$_2$ | H$_2$ | Ar | O$_2$ | RDC | C | E |
|---|---|---|---|---|---|---|---|---|---|---|---|
| | | | | | | | | | | ESC Temp. | |
| | | | | Gas | | | | | | | |
| Hard Mask Removal | 50 | 0 | 200 | 150 | | | | | 50 | 40 | 40 |

More specifically, concurrently controlling integration operating variables in the etching the hard mask layer process may include introducing CF$_4$ into the etch chamber at a flow rate of 150 sccm and introducing O$_2$ into the etch chamber at a flow rate of 15 sccm at a chamber pressure of 40 mT. Additionally, concurrently controlling integration operating variables in the etching the hard mask layer process may include maintaining a radical distribution control (RDC) of 50, and an electrostatic chuck (ESC) temperature of 40° C. at the center and at the edge of the ESC. Also, concurrently controlling integration operating variables in the etching the hard mask layer process may include setting a Radio frequency (RF) power source to 100 W.

In an embodiment concurrently controlling integration operating variables in the etching the intermediary layer process may include introducing N$_2$ into the etch chamber at a flow rate of 125 sccm and introducing H$_2$ into the etch chamber at a flow rate of 240 sccm at a chamber pressure of 80 mT. Concurrently controlling integration operating variables in the etching the intermediary layer process may also include maintaining a radical distribution control (RDC) of 50, and an electrostatic chuck (ESC) temperature of 45° C. at the center and 50° C. at the edge of the ESC. Additionally, concurrently controlling integration operating variables in the etching the intermediary layer process may include setting a Radio frequency (RF) power source to 100 W and a microwave (MW) power source to 2000 W.

In an embodiment, concurrently controlling integration operating variables in the removing the hard mask process may include introducing CF$_4$ into the etch chamber at a flow rate of 150 sccm and introducing N$_2$ into the etch chamber at a flow rate of 150 sccm at a chamber pressure of 50 mT. Also, concurrently controlling integration operating variables in the removing the hard mask process may include maintaining a radical distribution control (RDC) of 50, and an electrostatic chuck (ESC) temperature of 40° C. at the center and at the edge of the ESC. Concurrently controlling integration operating variables in the removing the hard mask process may also include setting a Radio frequency (RF) power source to 200 W.

In an embodiment, concurrently controlling integration operating variables in the thinning the hard mask layer process may include introducing CF$_4$ into the etch chamber at a flow rate of 150 sccm at a chamber pressure of 50 mT. Concurrently controlling integration operating variables in the thinning the hard mask layer process may also include maintaining a radical distribution control (RDC) of 50, and an electrostatic chuck (ESC) temperature of 40° C. at the center and at the edge of the ESC. Additionally, concurrently controlling integration operating variables in the thinning the hard mask layer process may include setting a Radio frequency (RF) power source to 200 W.

In an embodiment, concurrently controlling integration operating variables in the clearing the photoresist layer process may include introducing Ar into the etch chamber at a flow rate of 200 sccm and introducing O$_2$ into the etch chamber at a flow rate of 21 sccm at a chamber pressure of 50 mT. concurrently controlling integration operating variables in the clearing the photoresist layer process may additionally include maintaining a radical distribution control (RDC) of 50, and an electrostatic chuck (ESC) temperature of 40° C. at the center and at the edge of the ESC. Also, concurrently controlling integration operating variables in the clearing the photoresist layer process may include setting a radio frequency (RF) power source to 100 W.

In an embodiment, concurrent control of integration operating variables may be operationally carried out by the controller 231, or other suitable structural components. One of ordinary skill in the art will recognize various alternative chemistries and processing parameters which may be equally suitable, or more suitable for the processing of certain types of workpieces, depending upon the chemical composition of the material layers utilized. For example, the gas constituents may be introduced at alternative flow rates. In one embodiment, ranges within +/−10% of those shown in Table 1 may be used. In another embodiment, ranges within +/−20% may be used. One of ordinary skill will recognize that alternative gas mixtures may be used, depending upon the chemical makeup of the photoresist layer, the hard mask layer, and/or the intermediary layer. One of ordinary skill will also recognize that additional operating parameters, such as pressures, temperatures, and power levels may be concurrently controlled or adjusted to meet integration objectives, depending upon the feature parameter targets, and the materials used.

Figure 10A:
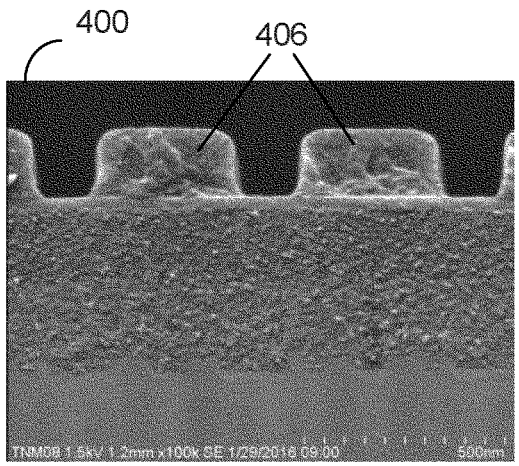
FIG. 10A is a cross-section image of one embodiment of a semiconductor device at one stage of a semiconductor device processing flow comprising in situ hard mask removal.
Figure 10B:
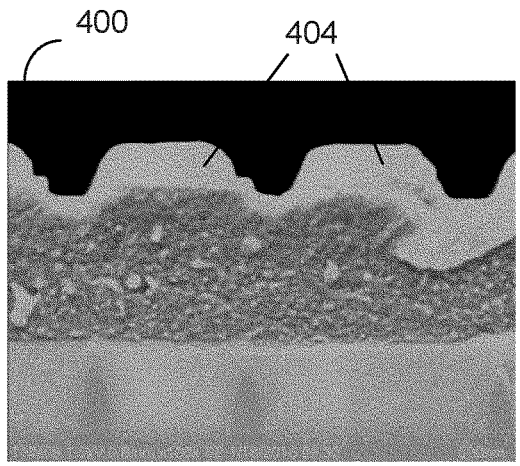
FIG. 10B is a cross-section image of one embodiment of a semiconductor device at one stage of a semiconductor device processing flow comprising in situ hard mask removal.
Figure 10C:
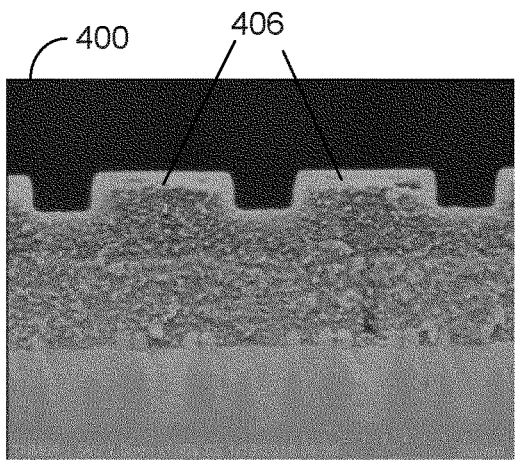
FIG. 10C is a cross-section image of one embodiment of a semiconductor device at one stage of a semiconductor device processing flow comprising in situ hard mask removal.
Figure 10D:
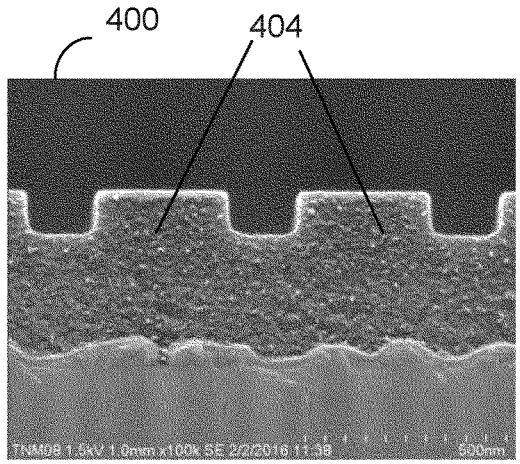
FIG. 10D is a cross-section image of one embodiment of a semiconductor device at one stage of a semiconductor device processing flow comprising in situ hard mask removal.
Figure 10E:
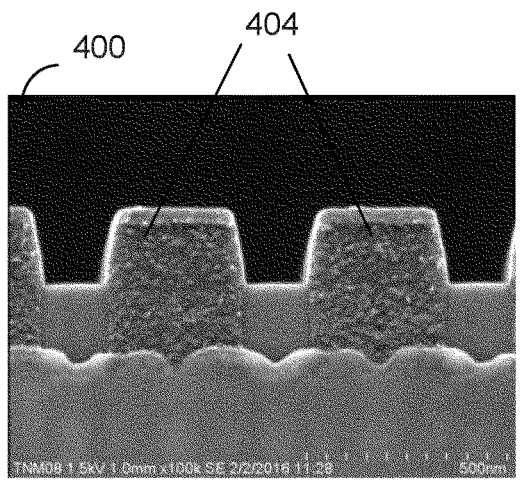
FIG. 10E is a cross-section image of one embodiment of a semiconductor device at one stage of a semiconductor device processing flow comprising in situ hard mask removal.

FIGS. 10A-E are cross-section images of a semiconductor workpiece 400 at various steps of the methods described in FIGS. 3-9. FIG. 10A illustrates an example of a semiconductor workpiece 400 received by the etch system 200, with a photoresist 406 as shown in FIG. 4. FIG. 10B illustrates an example of a semiconductor workpiece 400 with the hard mask layer 404 opened, as shown at FIG. 5. FIG. 10C illustrates an example of a semiconductor workpiece 400 with the photoresist layer 406 cleared, as shown at FIG. 6. FIG. 10D illustrates an example of a semiconductor workpiece 400 with the hard mask layer 404 thinned, as shown at FIG. 7. FIG. 10E illustrates an example of a semiconductor workpiece 400 hard mask layer 404 removed, as shown at FIG. 9.

Figure 11:
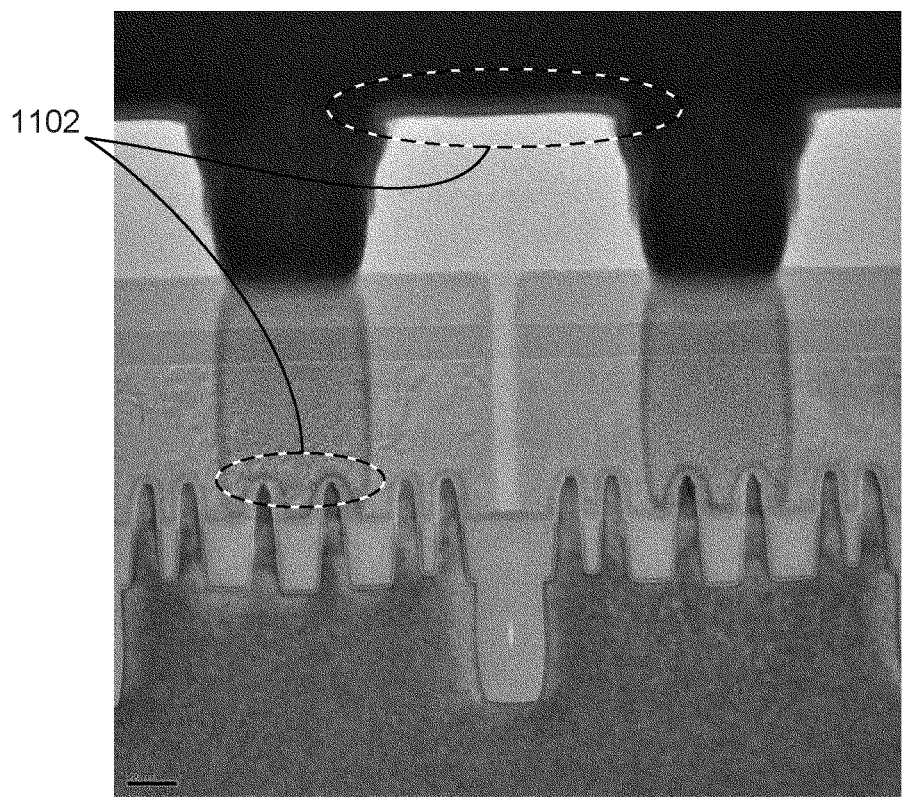
FIG. 11 is a cross-section image of one embodiment of a semiconductor device formed by a method for in situ hard mask removal.

FIG. 11 is a cross-section image of one embodiment of a semiconductor device formed by the methods described in FIGS. 3-9. By using the methods of FIGS. 3-9, there is minimal damage done to the spacer around the fins, and the mask is completely removed. The wafer is immediately ready for the feature etch process, without ever needing to use a wet etch step. This eliminates two instances of waiting to transfer a lot to a new tool, by simply adding two quick plasma etch steps to the mask opening process. In the example in the images on the new slide, there is minimal etching of the nitride spacer covering the fins in the regions 1102, which confirms that the process of FIGS. 3-9 can be used to adequately process the semiconductor workpiece 400 in a single etch system 200, without compromising device quality.

In summary, the integration objectives can include a) performing all the etches in a single etch chamber, (b) reducing the exposure of the hard mask to harsh removal chemistries, (c) ensuring no damage to the features being protected by the hard mask in the intermediary layer, (d) eliminating two instances of wafer transfer and waiting, thus saving processing time, and (e) achieving target CD, LWR, and LER characteristics of fabricated features. As mentioned above, up to one hour of processing time per lot may be saved. The single etch chamber can be a dry etch plasma chamber. For example, the features being protected by the hard mask in the intermediary layer maybe fins of a FinFET.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for semiconductor processing, comprising:
   receiving a semiconductor workpiece comprising a substrate, an intermediary layer, a hard mask layer, and a photoresist layer in an etch chamber;
   etching the hard mask layer to open a region left exposed by the photoresist layer;
   etching the intermediary layer in a region left exposed by the hard mask layer, the intermediary layer being a layer where a feature is exposed or formed;
   removing the hard mask layer; and
   concurrently controlling integration operating variables in the etching the hard mask layer, etching the intermediary layer, removing the hard mask layer processes, and in at least one of a clearing the photoresist layer process and a thinning the hard mask layer process in order to meet integration objectives;
   wherein etching the hard mask layer, etching the intermediary layer, and removing the hard mask layer are performed in the etch chamber, and without the semiconductor workpiece being removed from the etch chamber;
   wherein the feature in the intermediate layer is not damaged during the etching the hard mask layer, etching the intermediary layer, and removing the hard mask layer; and
   wherein concurrently controlling integration operating variables in order to meet integration objectives includes:
       performing measurements of integration operating variables; and
       performing adjustments of one or more of the integration operating variables in order to meet integration objectives; or
       performing in situ online measurements of integration operating variables; and
       performing adjustments of one or more of the integration operating variables in order to meet integration objectives, wherein the adjustments are based on the in situ online measurements of the integration operating variables.

2. The method of claim 1, further comprising clearing the photoresist layer in the etch chamber.

3. The method of claim 1, further comprising thinning the hard mask layer in the etch chamber.

4. The method of claim 3, wherein thinning the hard mask layer comprises etching with an etch chemistry that etches the hard mask layer and the intermediary layer at substantially the same rate.

5. The method of claim 1, wherein concurrently controlling integration operating variables in the etching the hard mask layer process comprises introducing $CF_4$ into the etch chamber at a flow rate of 150 sccm and introducing $O_2$ into the etch chamber at a flow rate of 15 sccm at a chamber pressure of 40 mT.

6. The method of claim 1, wherein concurrently controlling integration operating variables in the etching the hard mask layer process comprises maintaining a radical distribution control (RDC) of 50, and an electrostatic chuck (ESC) temperature of 40 degrees Celsius at the center and at the edge of the ESC.

7. The method of claim 1, wherein concurrently controlling integration operating variables in etching the hard mask layer process comprises setting a radio frequency (RF) power source to 100 W.

8. The method of claim 1, wherein concurrently controlling integration operating variables in the etching the intermediary layer process comprises introducing $N_2$ into the etch chamber at a flow rate of 125 sccm and introducing $H_2$ into the etch chamber at a flow rate of 240 sccm at a chamber pressure of 80 mT.

9. The method of claim 1, wherein concurrently controlling integration operating variables in the etching the intermediary layer process comprises maintaining a radical distribution control (RDC) of 50, and an electrostatic chuck (ESC) temperature of 45 degrees Celsius at the center and 50 degrees Celsius at the edge of the ESC.

10. The method of claim 1, wherein concurrently controlling integration operating variables in etching the intermediary layer process comprises setting a radio frequency (RF) power source to 100 W and a microwave (MW) power source to 2000 W.

11. The method of claim 1, wherein concurrently controlling integration operating variables in the removing the hard mask layer process comprises introducing $CF_4$ into the etch chamber at a flow rate of 150 sccm and introducing $N_2$ into the etch chamber at a flow rate of 150 sccm at a chamber pressure of 50 mT.

12. The method of claim 1, wherein concurrently controlling integration operating variables in the removing the hard mask layer process comprises maintaining a radical distribution control (RDC) of 50, and an electrostatic chuck (ESC) temperature of 40 degrees Celsius at the center and at the edge of the ESC.

13. The method of claim 1, wherein concurrently controlling integration operating variables in removing the hard mask layer process comprises setting a radio frequency (RF) power source to 200 W.

14. The method of claim 1, wherein concurrently controlling integration operating variables in the thinning the hard mask layer process comprises introducing $CF_4$ into the etch chamber at a flow rate of 150 sccm at a chamber pressure of 50 mT.

15. The method of claim 1, wherein concurrently controlling integration operating variables in the thinning the hard mask layer process comprises maintaining a radical distribution control (RDC) of 50, and an electrostatic chuck (ESC) temperature of 40 degrees Celsius at the center and at the edge of the ESC.

16. The method of claim 1, wherein concurrently controlling integration operating variables in the thinning the hard mask layer process comprises setting a radio frequency (RF) power source to 200 W.

17. The method of claim 1, wherein concurrently controlling integration operating variables in the clearing the photoresist layer process comprises introducing Ar into the etch chamber at a flow rate of 200 sccm and introducing $O_2$ into the etch chamber at a flow rate of 21 sccm at a chamber pressure of 50 mT; or
   wherein concurrently controlling integration operating variables in the clearing the photoresist layer process comprises maintaining a radical distribution control (RDC) of 50, and an electrostatic chuck (ESC) temperature of 40 degrees Celsius at the center and at the edge of the ESC; and/or
   wherein concurrently controlling integration operating variables in clearing the photoresist layer process comprises setting a radio frequency (RF) power source to 100 W.

* * * * *